United States Patent
Sumihiro et al.

(10) Patent No.: US 10,319,067 B2
(45) Date of Patent: Jun. 11, 2019

(54) SENSOR MODULE, METHOD OF CONTROLLING THE SAME, AND ELECTRONIC APPARATUS

(71) Applicant: SONY CORPORATION, Tokyo (JP)

(72) Inventors: Hiroshi Sumihiro, Kanagawa (JP); Koji Enoki, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 200 days.

(21) Appl. No.: 15/310,186

(22) PCT Filed: May 12, 2015

(86) PCT No.: PCT/JP2015/063572
§ 371 (c)(1),
(2) Date: Nov. 10, 2016

(87) PCT Pub. No.: WO2015/178242
PCT Pub. Date: Nov. 26, 2015

(65) Prior Publication Data
US 2017/0148133 A1 May 25, 2017

(30) Foreign Application Priority Data

May 21, 2014 (JP) .............................. 2014-105137

(51) Int. Cl.
*G11C 7/10* (2006.01)
*G06T 1/60* (2006.01)
*G06F 3/06* (2006.01)
*H04N 5/907* (2006.01)
(Continued)

(52) U.S. Cl.
CPC .............. *G06T 1/60* (2013.01); *G06F 3/0604* (2013.01); *G06F 3/0659* (2013.01); *G06F 3/0683* (2013.01); *G06F 9/00* (2013.01); *G06F 9/30* (2013.01); *G11C 7/1048* (2013.01); *H04N 5/907* (2013.01)

(58) Field of Classification Search
CPC ................................. G06T 1/60; G11C 7/1048
See application file for complete search history.

(56) References Cited

U.S. PATENT DOCUMENTS

| | | | | |
|---|---|---|---|---|
| 5,036,475 | A | * | 7/1991 | Ueda ...................... G09G 5/024 345/534 |
| 7,184,314 | B2 | * | 2/2007 | Hosono .................. G11C 16/32 365/148 |

(Continued)

FOREIGN PATENT DOCUMENTS

| | | |
|---|---|---|
| JP | 63-120348 A | 5/1988 |
| JP | 04-281289 A | 10/1992 |

(Continued)

*Primary Examiner* — Son L Mai
(74) *Attorney, Agent, or Firm* — Chip Law Group

(57) ABSTRACT

A sensor module of the present disclosure includes a sensor section; a memory section having a plurality of memory regions; an arithmetic operation section that performs a predetermined arithmetic operation while accessing the memory section on a basis of a detection result of the sensor section; and a memory control section that controls the memory section to start access to the memory regions at different timings.

8 Claims, 11 Drawing Sheets

(51) Int. Cl.
*G06F 9/00* (2006.01)
*G06F 9/30* (2018.01)

(56) References Cited

U.S. PATENT DOCUMENTS

| | | | | |
|---|---|---|---|---|
| 7,268,809 B2 * | 9/2007 | Wong | ............... | G11C 27/005 348/207.1 |
| 7,808,527 B2 * | 10/2010 | Kuroki | ............ | H04N 5/2258 348/207.99 |
| 10,008,249 B2 * | 6/2018 | Antonyan | ............ | G11C 11/1655 |
| 2011/0208939 A1 * | 8/2011 | Takizawa | ............ | G06F 12/0207 711/167 |

FOREIGN PATENT DOCUMENTS

| | | |
|---|---|---|
| JP | 2005-276296 A | 10/2005 |
| JP | 2008-041142 A | 2/2008 |
| JP | 2011-028790 A | 2/2011 |
| JP | 2012-063874 A | 3/2012 |

* cited by examiner

[ FIG. 1 ]
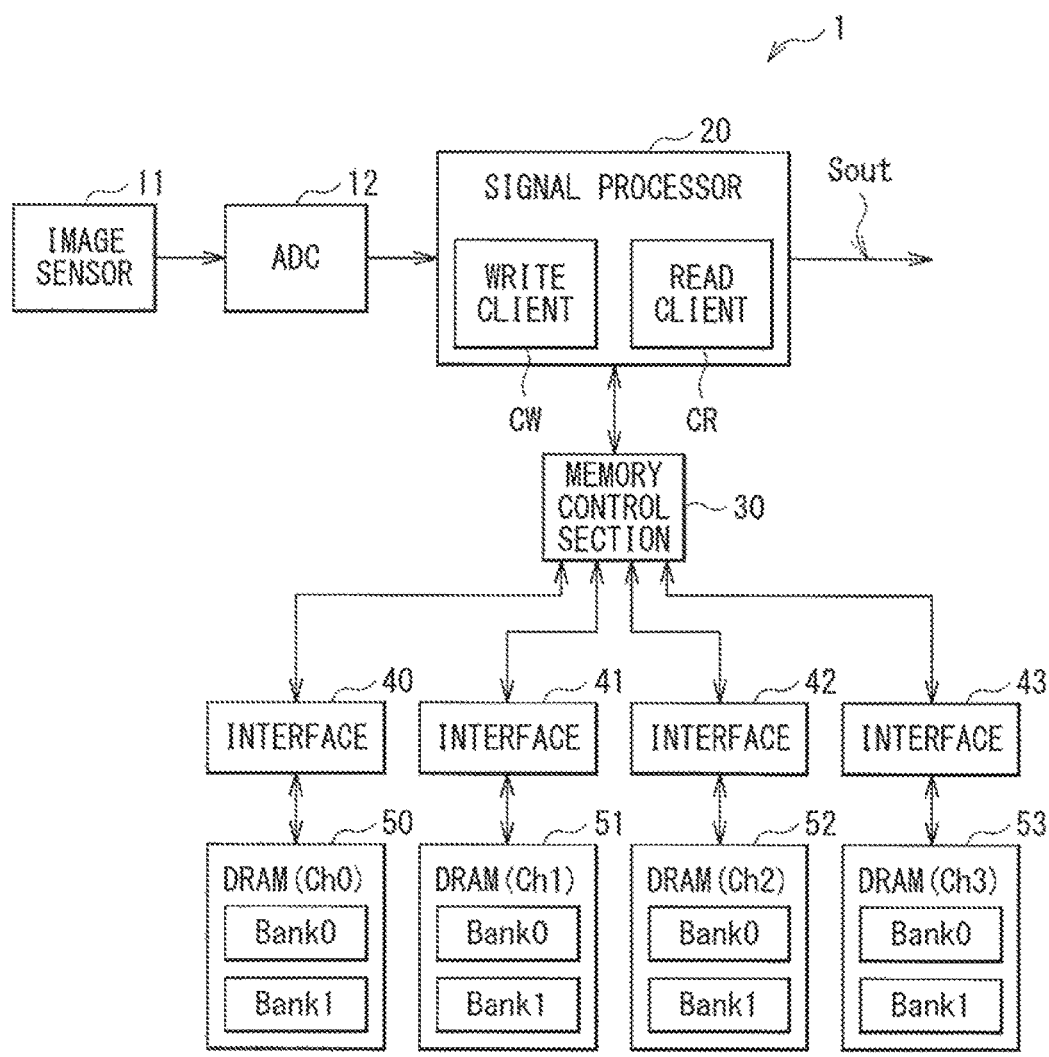

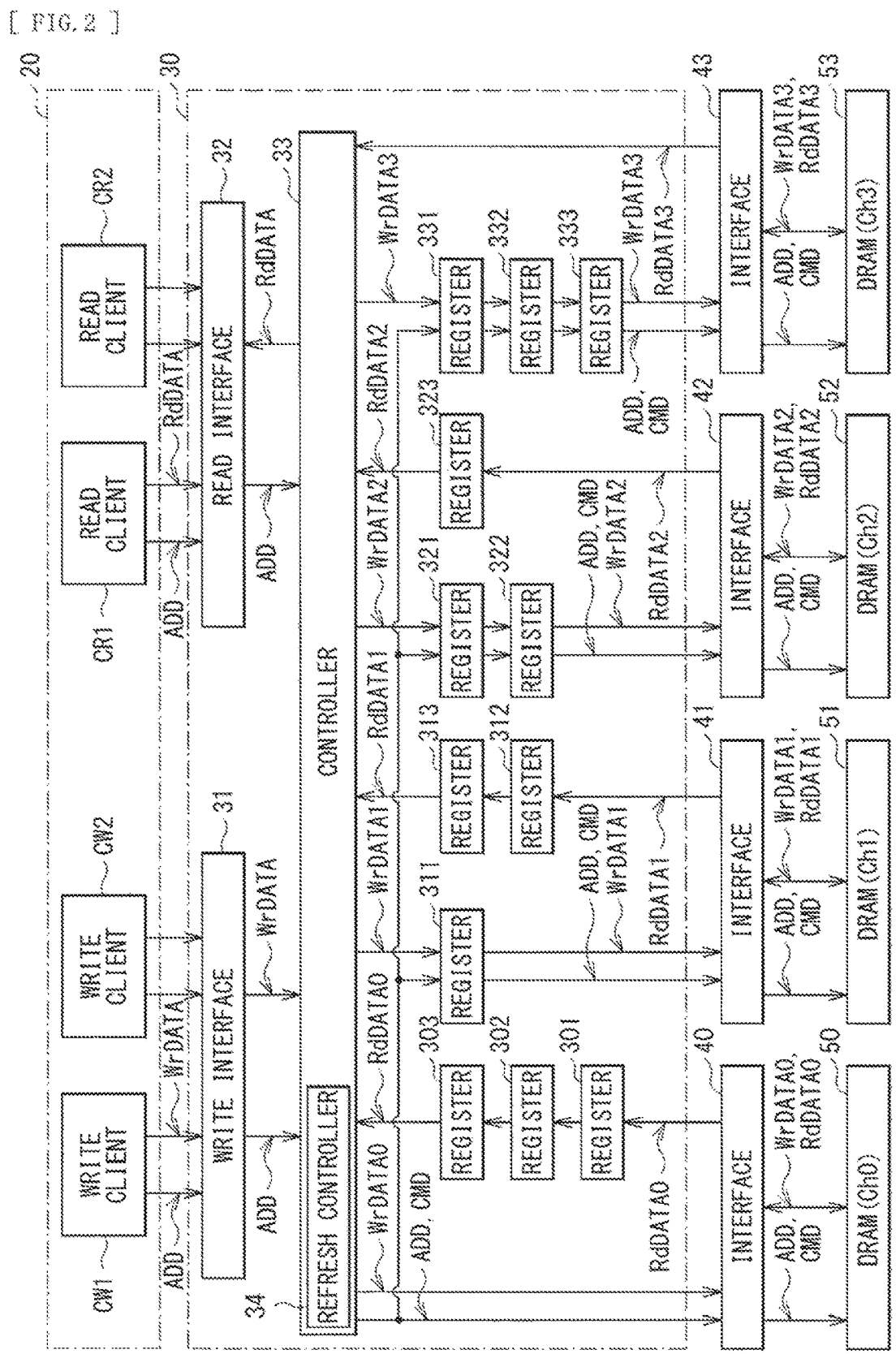

[FIG. 3]
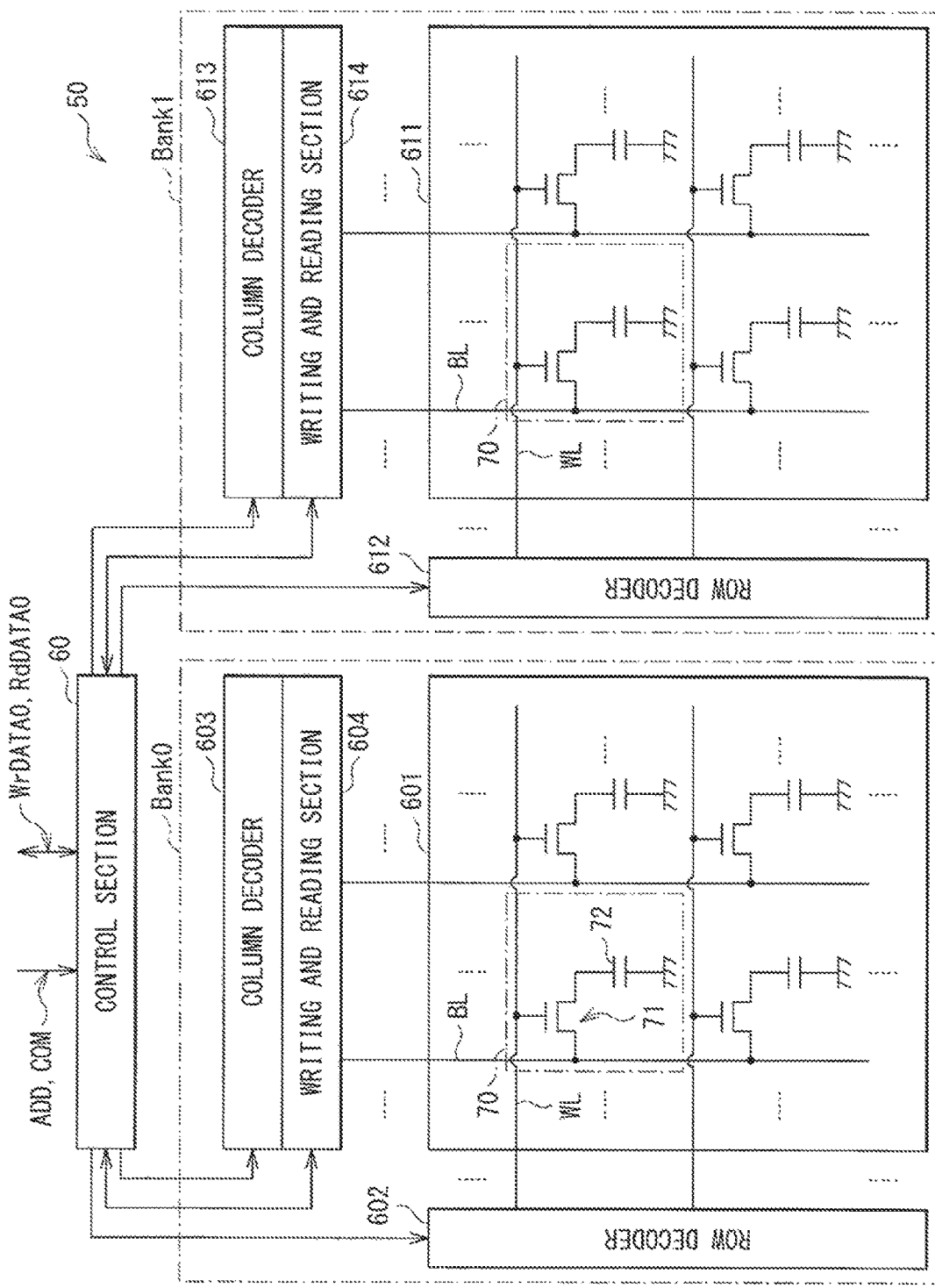

[FIG. 4]
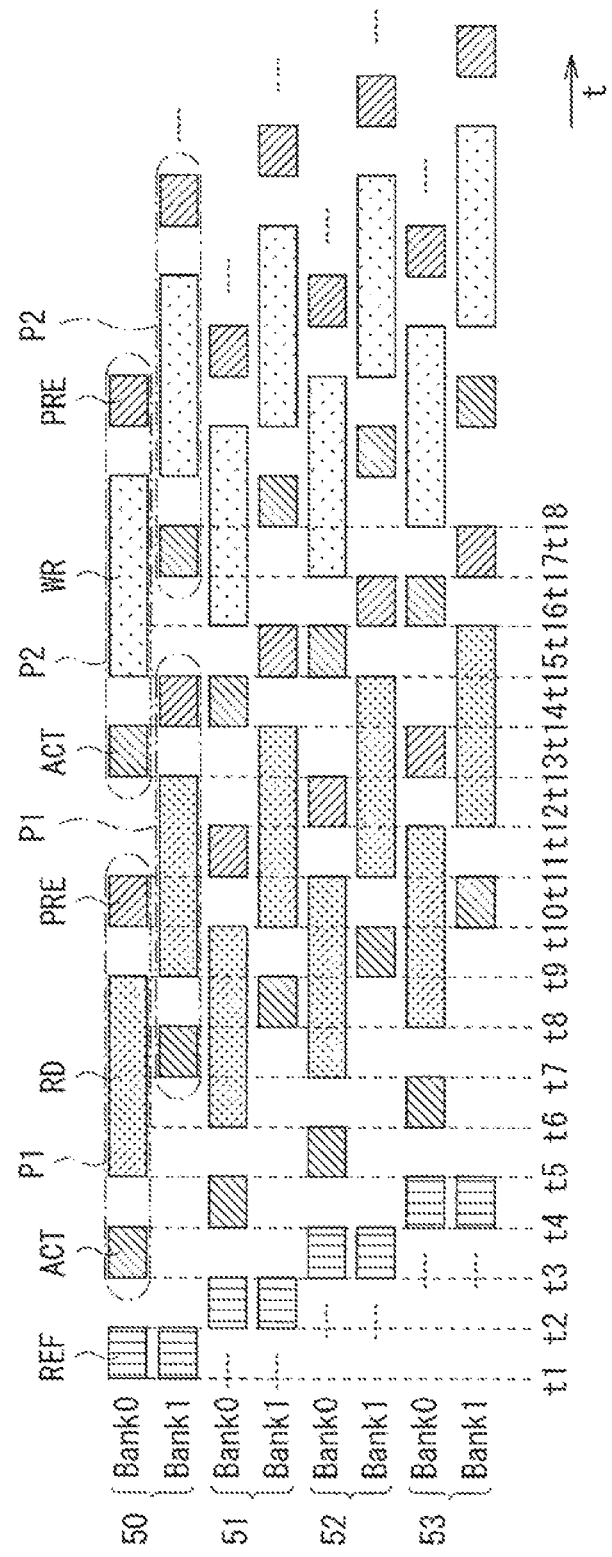

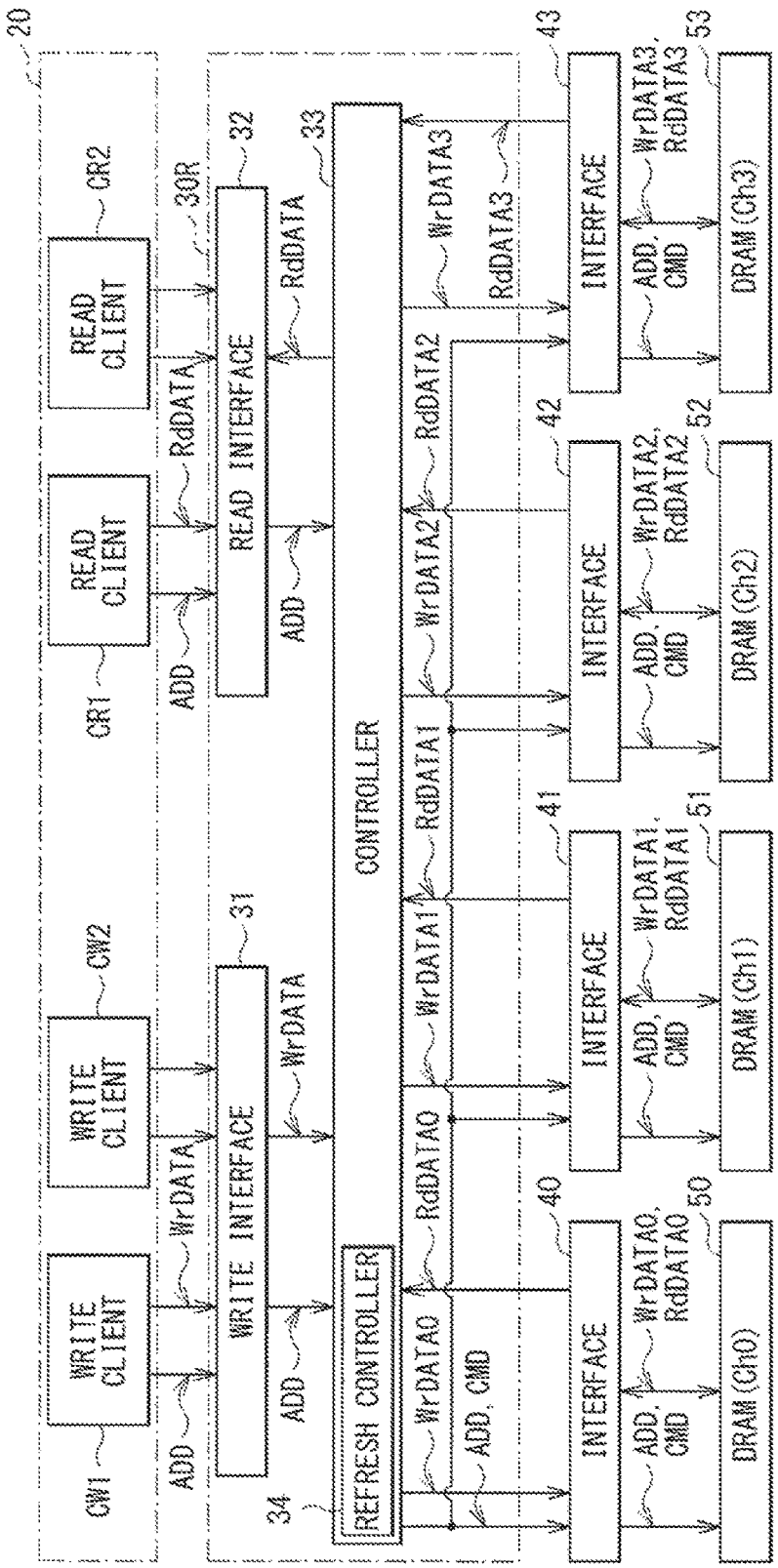
[FIG. 5]

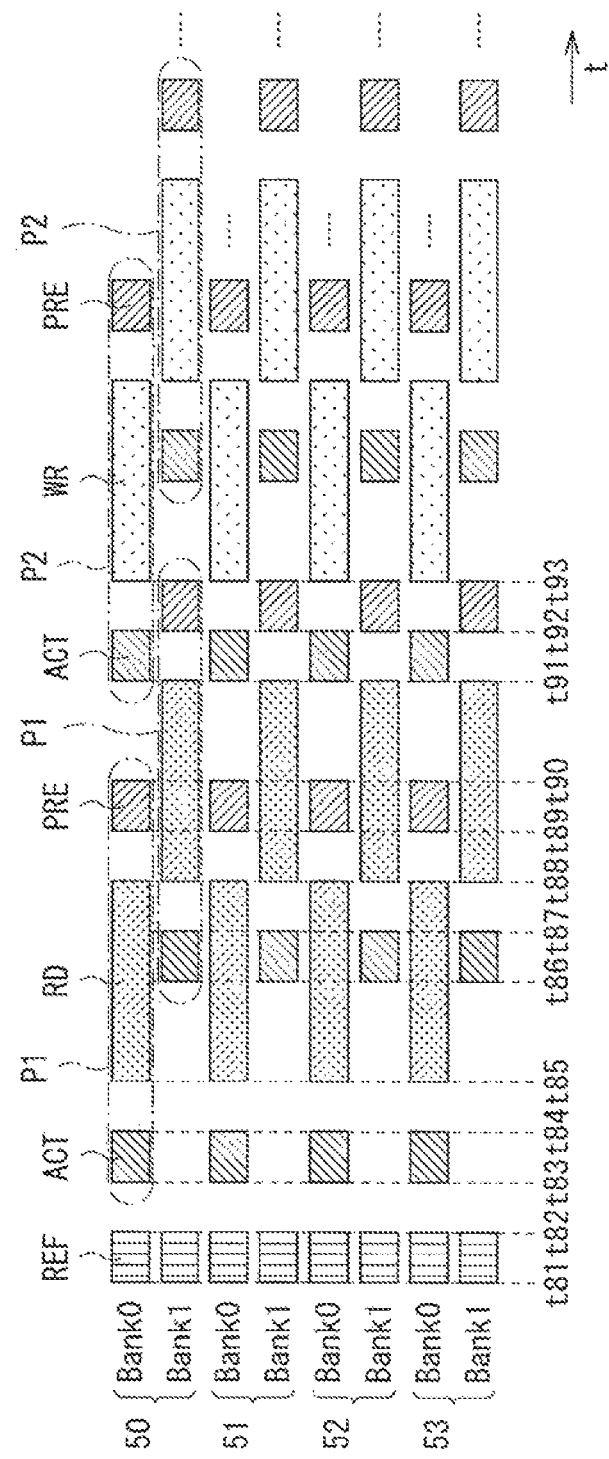
[FIG. 6]

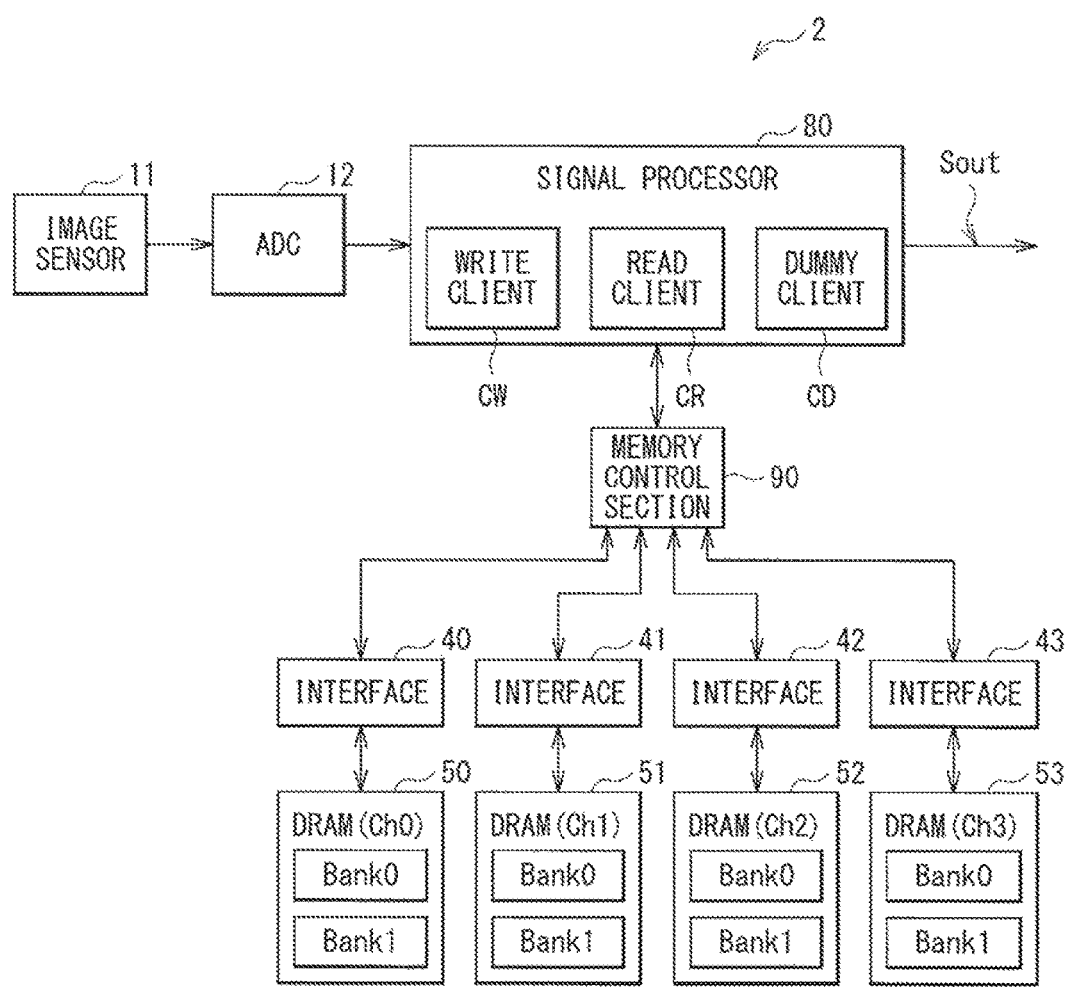
[FIG. 7]

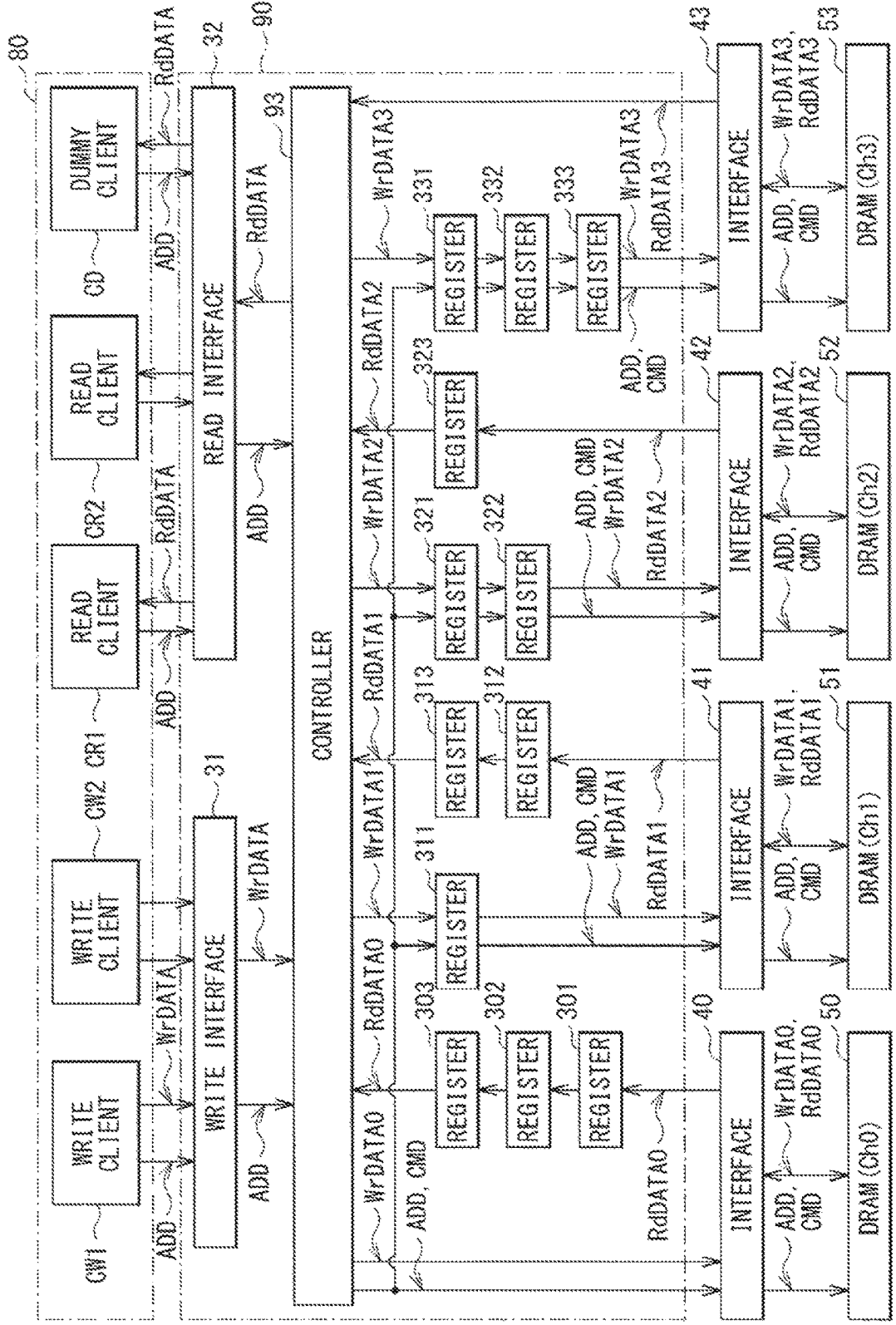
[FIG. 8]

[FIG. 9]
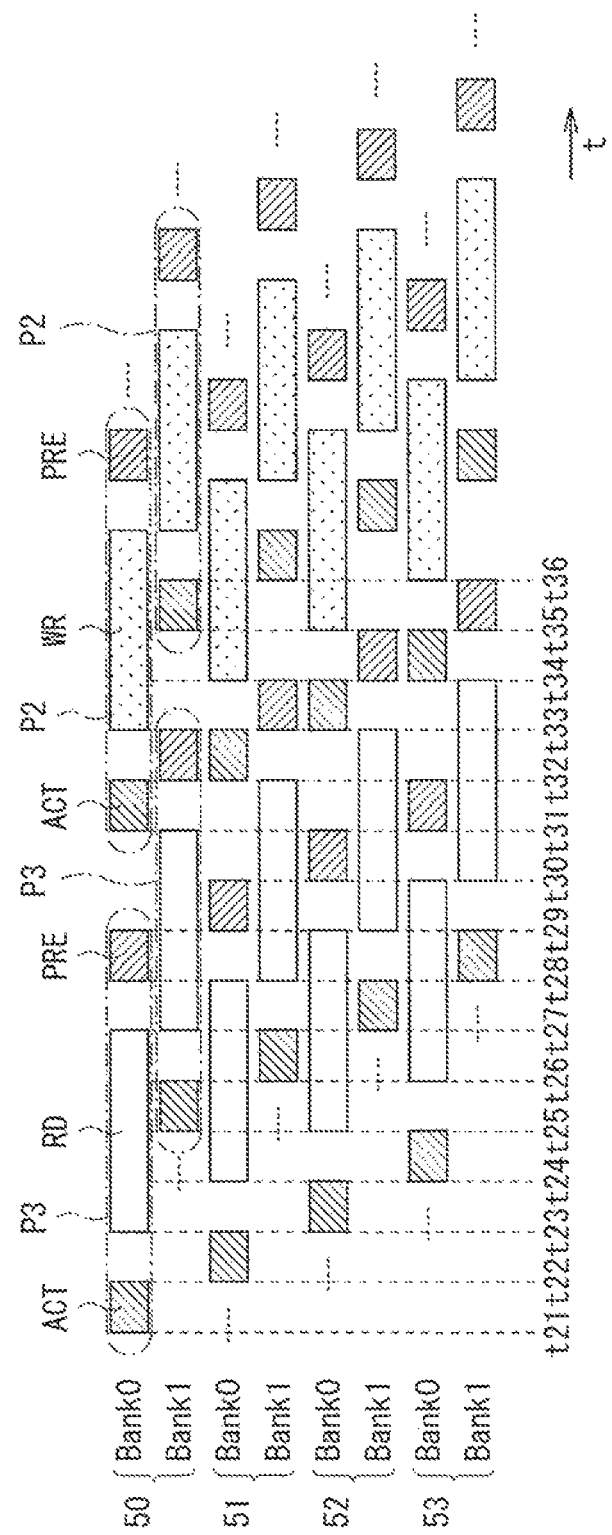

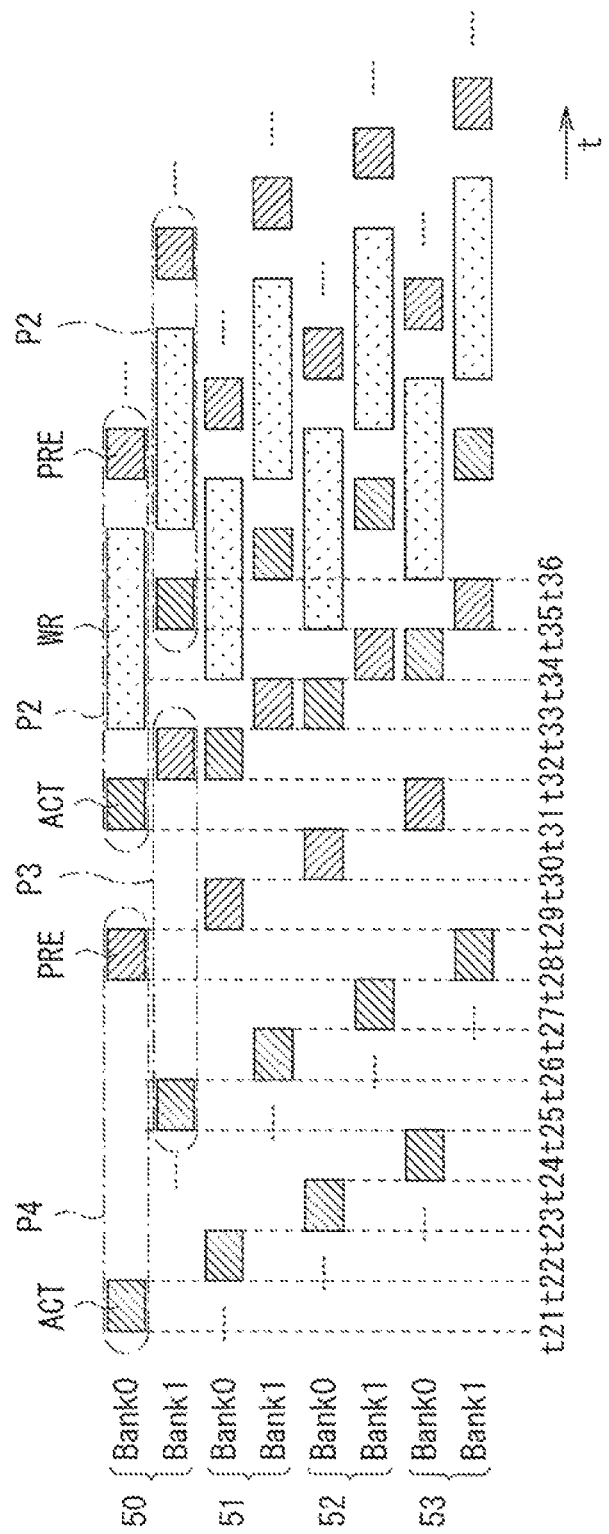
[FIG. 10]

[ FIG. 11 ]
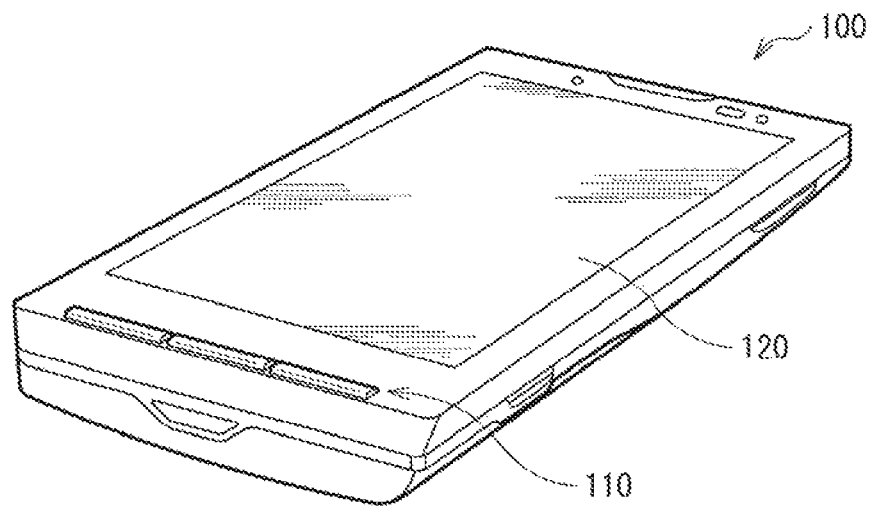
[ FIG. 12 ]
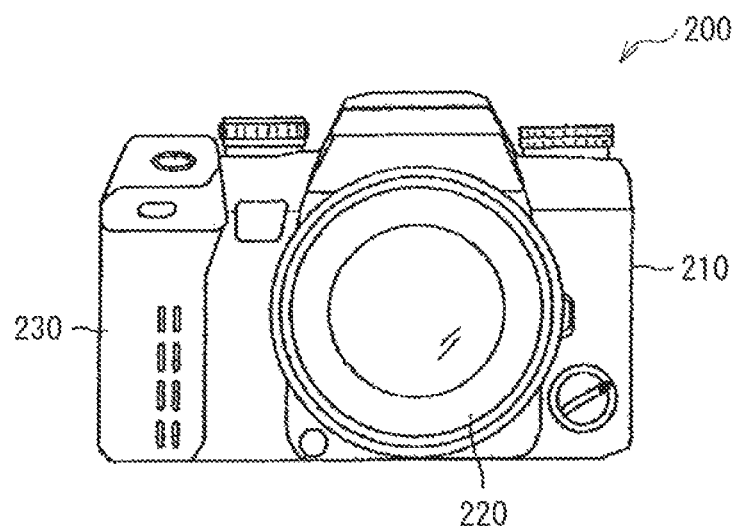

SENSOR MODULE, METHOD OF CONTROLLING THE SAME, AND ELECTRONIC APPARATUS

CROSS REFERENCE TO RELATED APPLICATIONS

This application is a U.S. National Phase of International Patent Application No. PCT/JP2015/063572 filed on May 12, 2015, which claims priority benefit of Japanese Patent Application No. JP 2014-105137 filed in the Japan Patent Office on May 21, 2014. Each of the above-referenced applications is hereby incorporated herein by reference in its entirety.

TECHNICAL FIELD

The present disclosure relates to a sensor module including a sensor, a method of controlling such a sensor module, and an electronic apparatus including such a sensor module.

BACKGROUND ART

In association with a recent advance in multi-functionality of electronic apparatuses, various sensors are mounted in electronic apparatuses. For example, a smartphone (high-performance mobile phone) is frequently equipped with an image sensor for photograph shooting and video shooting. As the image sensor, for example, a CMOS (Complementary MOS) image sensor allowing for achievement of downsizing and reduction in power consumption is frequently used. The electronic apparatuses achieve various functions with use of such an image sensor.

Incidentally, the electronic apparatuses frequently use a DRAM (Dynamic Random Access Memory) for storage of information (data). In an electronic apparatus equipped with a DRAM, noise generated by the DRAM may exert an influence on performance of the electronic apparatus in some cases. There have been disclosed various technologies for reduction in an influence of such noise. For example, Patent Literature 1 discloses a semiconductor storage unit that includes a plurality of DRAM memory sections and causes a timing of a refresh operation to be different for each of the DRAM memory sections. The semiconductor storage unit causes the timing of the refresh operation to be different in such a manner, thereby achieving reduction in power source noise caused by the refresh operation.

CITATION LIST

Patent Literature

Patent Literature 1: Japanese Unexamined Patent Application Publication No. 2011-028790

SUMMARY

Incidentally, it is desirable that a sensor module have high detection accuracy in general. More specifically, for example, in a sensor module equipped with an image sensor, high image quality is desired.

It is therefore desirable to provide a sensor module, a method of controlling a sensor module, and an electronic apparatus each of which allows for enhancement of detection accuracy.

A sensor module according to an embodiment of the present disclosure includes a sensor section, a memory section, an arithmetic operation section, and a memory control section. The memory section has a plurality of memory regions. The arithmetic operation section performs a predetermined arithmetic operation while accessing the memory section on a basis of a detection result of the sensor section. The memory control section controls the memory section to start access to the memory regions at different timings.

A method of controlling a sensor module according to an embodiment of the present disclosure includes: performing a predetermined arithmetic operation while accessing a memory section having a plurality of memory regions on a basis of a detection result of a sensor section; and controlling the memory section to start access to the memory regions at different timings.

An electronic apparatus according to an embodiment of the present disclosure includes the foregoing sensor module, and may correspond to, for example, but not limited to, a smartphone, a tablet computer, a digital camera, a video camera, and a notebook personal computer.

In the sensor module, the method of controlling the sensor module, and the electronic apparatus according to the embodiments of the present disclosure, the predetermined arithmetic operation is performed while accessing the memory section on the basis of the detection result of the sensor section. At this occasion, access to the memory regions is controlled to start at different timings.

According to the sensor module, the method of controlling the sensor module, and the electronic apparatus according to the embodiments of the present disclosure, the access to the memory regions is controlled to start at different timings, which makes it possible to enhance detection accuracy. Note that effects described here are non-limiting. Effects achieved by the technology may be one or more of effects described in the present disclosure.

BRIEF DESCRIPTION OF DRAWINGS

FIG. 1 is a block diagram illustrating a configuration example of a sensor module according to a first embodiment of the present disclosure.

FIG. 2 is a block diagram illustrating a configuration example of a memory control section illustrated in FIG. 1.

FIG. 3 is a block diagram illustrating a configuration example of a DRAM illustrated in FIG. 1.

FIG. 4 is a timing chart illustrating an operation example of the sensor module illustrated in FIG. 1.

FIG. 5 is a block diagram illustrating a configuration example of a memory control section according to a comparative example.

FIG. 6 is a timing chart illustrating an operation example of a sensor module according to the comparative example.

FIG. 7 is a block diagram illustrating a configuration example of a sensor module according to a second embodiment.

FIG. 8 is a block diagram illustrating a configuration example of a memory control section illustrated in FIG. 7.

FIG. 9 is a timing chart illustrating an operation example of the sensor module illustrated in FIG. 7.

FIG. 10 is a timing chart illustrating an operation example of a sensor module according to a modification example of the second embodiment.

FIG. 11 is a perspective view of an appearance of a smartphone to which a sensor module according to an embodiment is applied.

FIG. 12 is a front view of an appearance of a digital camera to which the sensor module according to the embodiment is applied.

EMBODIMENTS FOR CARRYING OUT THE INVENTION

In the following, some embodiments of the present disclosure are described in detail with reference to the drawings. It is to be noted that description is given in the following order.
1. First Embodiment
2. Second Embodiment
3. Application Examples

1. First Embodiment

Configuration Example

FIG. 1 illustrates a configuration example of a sensor module according to a first embodiment. A sensor module 1 is a module equipped with an image sensor and a DRAM. It is to be noted that a method of controlling a sensor module according to an embodiment of the present disclosure is embodied by the present embodiment, and description thereof is therefore given together.

The sensor module 1 includes an image sensor 11, an ADC (Analog to Digital Converter) 12, a signal processor 20, a memory control section 30, interfaces 40 to 43, and DRAMs 50 to 53.

The image sensor 11 acquires image data, and may be configured with use of a CMOS image sensor, for example. The image sensor 11 includes a plurality of pixels, and sequentially supplies a detection voltage (an analog voltage) in each of the pixels to the ADC 12.

The ADC 12 converts the detection voltage (the analog voltage) in each of the pixels supplied from the image sensor 11 into a digital code. Thereafter, the ADC 12 supplies the digital code resulting from such conversion to the signal processor 20.

The signal processor 20 performs predetermined signal processing on the image data supplied from the ADC 12, and outputs a result of the image processing as a signal Sout. The signal processor 20 uses the DRAMs 50 to 43 as working memories when performing the predetermined signal processing. At this occasion, in the signal processor 20, a write client CW, a read client CR, and some other client operate to access the DRAMs 50 to 53 through the memory control section 30 and the interfaces 40 to 43. The write client CW supplies an address ADD and write data WrDATA to the memory control section 30, and writes data to the DRAMs 50 to 53. Moreover, the read client CR supplies the address ADD to the memory control section 30, and receives, from the memory control section 30, read data RdDATA read from the DRAMs 50 to 43.

The memory control section 30 controls the DRAMs 50 to 53 through the interfaces 40 to 43 in accordance with an instruction from the signal processor 20.

FIG. 2 illustrates a configuration example of the memory control section 30. FIG. 2 illustrates, in addition to the memory control section 30, some functions of the signal processor 20, the interfaces 40 to 43, and the DRAMs 50 to 53.

The memory control section 30 includes a write interface 31, a read interface 32, a controller 33, and registers 301 to 303, 311 to 313, 321 to 323, and 331 to 333.

The write interface 31 arbitrates access from the write client CW (two write clients CW1 and CW2 in this example) that operates in the signal processor 20. Further, the write interface 31 delivers, to the controller 33, the address ADD and the write data WrDATA (for example, data of 512 bits) supplied from each write client CW.

The read interface 32 arbitrates access from the read client CR (two read clients CR1 and CR2 in this example) that operates in the signal processor 20. Further, the read interface 32 delivers, to the controller 33, the address ADD supplied from each read client CR, and delivers, to the read client CR that provides an instruction for reading of data, the read data RdDATA (for example, data of 512 bits) supplied from the controller 33.

The controller 33 controls operations of the DRAMs 50 and 53 on the basis of instructions from the write interface 31 and the read interface 32. More specifically, the controller 33 generates a control command CMD (for example, a read command RD, a write command WR, an activate command ACT, a precharge command PRE, or some other command) on the basis of the instructions from the write interface 31 and the read interface 32. Further, the controller 33 supplies the addresses ADD supplied from the write interface 31 and the read interface 32 and the thus-generated control command CMD to the DRAM 50 through the interface 40, to the DRAM 51 through the register 311 and the interface 41, to the DRAM 52 through the registers 321 and 322 and the interface 42, and to the DRAM 53 through the registers 331 to 333 and the interface 43. Further, the controller 33 supplies write data WrDATA0 (for example, data of 128 bits) included in the write data WrDATA supplied from the write interface 31 to the DRAM 50 through the interface 40. The controller 33 supplies write data WrDATA1 (for example, data of 128 bits) included in the write data WrDATA to the DRAM 51 through the register 311 and the interface 41. The controller 33 supplies write data WrDATA2 (for example, data of 128 bits) included in the write data WrDATA to the DRAM 52 through the registers 321 and 322 and the interface 42. The controller 33 supplies write data WrDATA3 (for example, data of 128 bits) included in the write data WrDATA to the DRAM 53 through the registers 331 to 333 and the interface 43. Moreover, the controller 33 supplies read data RdDATA0 (for example, data of 128 bits), read data RdDATA1 (for example, data of 128 bits), read data RdDATA2 (for example, data of 128 bits), and read data RdDATA3 (for example, data of 128 bits) as read data RdDATA to the read interface 32. The read data RdDATA0 is supplied from the DRAM 50 through the interface 40 and the registers 301 to 303. The read data RdDATA1 is supplied from the DRAM 51 through the interface 41 and the registers 312 and 313. The read data RdDATA2 is supplied from the DRAM 52 through the interface 42 and the register 323. The read data RdDATA3 is supplied from the DRAM 53 through the interface 43.

Moreover, the controller 33 includes a refresh controller 34. The refresh controller 34 periodically generates a refresh command REF. The controller 33 supplies the refresh command REF generated by the refresh controller 34 as a control command CMD to the DRAM 50 through the interface 40, to the DRAM 51 through the register 311 and the interface 41, to the DRAM 52 through the registers 321 and 322 and the interface 42, and to the DRAM 53 through the registers 331 to 333 and the interface 43.

The registers 301 to 303, 311 to 313, 321 to 323, and 331 to 333 each operate in synchronization with an unillustrated clock signal, and delay data. More specifically, the registers 301 to 303 sequentially delay the read data RdDATA0 supplied from the interface 40, and supplies the read data RdDATA0 to the controller 33. The register 311 delays the address ADD, the control command CMD, and the write data WrDATA1 that are supplied from the controller 33, and supplies the address ADD, the control command CMD, and the write data WrDATA1 to the interface 41. The registers 312 and 313 sequentially delay the read data RdDATA1 supplied from the interface 41, and supplies the read data RdDATA1 to the controller 33. The registers 321 and 322 sequentially delay the address ADD, the control command CMD, and the write data WrDATA2 that are supplied from the controller 33, and supplies the address ADD, the control command CMD, and the write data WrDATA2 to the interface 42. The register 323 delays the read data RdDATA2 supplied from the interface 42, and supplies the read data RdDATA2 to the controller 33. Moreover, the registers 331 to 333 sequentially delay the address ADD, the control command CMD, and the write data WrDATA3 that are supplied from the controller 33, and supplies the address ADD, the control command CMD, and the write data WrDATA3 to the interface 43.

As described above, in the sensor module 1, a different number of registers are inserted each between the controller 33 and the DRAM 50, between the controller 33 and the DRAM 51, between the controller 33 and the DRAM 52, and between the controller 33 and the DRAM 53. In the sensor module 1, this makes it possible to access each of the DRAMs 50 to 53 at a different timing, to decrease a peak of a noise amount generated by the DRAMs 50 to 53, and to reduce degradation in detection accuracy of the image sensor 11, as will be described later.

Moreover, in the sensor module 1, a same number of registers are provided to each of the DRAMs 50 to 53. More specifically, three register 301 to 303 are provided in a path to the DRAM 50. Three registers 311 to 313 are provided in a path to the DRAM 51. Three registers 321 to 323 are provided in a path to the DRAM 52. Three registers 331 to 333 are provided in a path to the DRAM 53. Accordingly, in the sensor module 1, for example, when data is read from the respective DRAMs 50 to 53, a delay amount is equal, which makes it possible to achieve synchronization.

The interfaces 40 to 43 are respectively interfaces of physical layers inserted between the memory control section 30 and the DRAM 50, between the memory control section 30 and the DRAM 51, between the memory control section 30 and the DRAM 52, and between the memory control section 30 and the DRAM 53. More specifically, the interface 40 supplies, to the DRAM 50, the address ADD, the control command CMD, and the write data WrDATA0 that are supplied from the controller 33, and supplies, to the register 301, the read data RdDATA0 supplied from the DRAM 50. The interface 41 supplies, to the DRAM 51, the address ADD, the control command CMD, and the write data WrDATA1 that are supplied from the register 311, and supplies, to the register 312, the read data RdDATA1 supplied from the DRAM 51. The interface 42 supplies, to the DRAM 52, the address ADD, the control command CMD, and the write data WrDATA2 that are supplied from the register 322, and supplies, to the register 323, the read data RdDATA2 supplied from the DRAM 52. Moreover, the interface 43 supplies, to the DRAM 53, the address ADD, the control command CMD, and the write data WrDATA3 that are supplied from the register 333, and supplies, to the controller 33, the read data RdDATA3 supplied from the DRAM 53.

The DRAMs 50 to 53 each function as a working memory of the signal processor 20. The DRAMs 50 to 53 respectively correspond to channels Ch0 to Ch3. The DRAMs 50 to 53 each have two banks Bank0 and Bank1. The DRAM 50 receives the address ADD, the control command CMD, and the write data WrDATA0 from the interface 40, and supplies the read data RdDATA0 to the interface 40. The DRAM 51 receives the address ADD, the control command CMD, and the write data WrDATA1 from the interface 41, and supplies the read data RdDATA1 to the interface 41. The DRAM 52 receives the address ADD, the control command CMD, and the write data WrDATA2 from the interface 42, and supplies the read data RdDATA2 to the interface 42. Moreover, the DRAM 53 receives the address ADD, the control command CMD, and the write data WrDATA3 from the interface 43, and supplies the read data RdDATA3 to the interface 43. In this example, the DRAMs 50 to 53 are configured as separate chips. It is to be noted that the DRAMs 50 to 53 is not limited thereto, and alternatively, for example, the DRAMs 50 to 54 may be integrated into one chip.

FIG. 3 illustrates a configuration example of the DRAM 50. It is to be noted that the DRAMs 51 to 53 have a similar configuration. The DRAM 50 includes memory arrays 601 and 611, row decoders 602 and 612, column decoders 603 and 613, writing and reading sections 604 and 614, and a control section 60. The memory array 601, the row decoder 602, the column decoder 603, and the writing and reading section 604 configure the bank Bank0. The memory array 611, the row decoder 612, the column decoder 613, and the writing and reading section 614 configure the bank Bank1. The bank Bank0 is described below as an example.

The memory array 601 includes a plurality of memory cells 70, a plurality of word lines WL, and a plurality of bit lines BL. The memory cells 70 are arranged in a matrix. The word lines WL extend in a row direction (a horizontal direction), and the bit lines BL extend in a column direction (a vertical direction). One end of each of the word lines WL is coupled to the row decoder 602, and one end of each of the bit lines BL is coupled to the writing and reading section 604.

The memory cells 70 each include a transistor 71 and a capacitor 72. The transistor 71 in this example is an N-channel MOSFET (Metal Oxide Semiconductor Field Effect Transistor). A gate, a source, and a drain of the transistor 71 are respectively coupled to the word line WL, the bit line BL, and one end of the capacitor 72. The capacitor 72 holds an electric charge to store data of 1 bit. The one end of the capacitor 72 is coupled to the drain of the transistor 71, and the other end of the capacitor 72 is grounded.

The row decoder 602 selects one row in the memory array 601 on the basis of an instruction from the control section 60. The column decoder 603 selects one column in the memory array 601 on the basis of an instruction from the control section 60.

The writing and reading section 604 writes data to the memory cell 70 selected by the row decoder 602 and the column decoder 603 or reads data from the memory cell 70 selected by the row decoder 602 and the column decoder 603, on the basis of an instruction from the control section 60. Moreover, the writing and reading section 604 also has a function of restoring (refreshing) data stored in the memory cell 70.

The control section 60 controls an operation of the DRAM 50 by exchange of a signal with the row decoders 602 and 612, the column decoders 603 and 613, and the writing and reading sections 604 and 614 on the basis of an instruction from the interface 40.

In the following, description is given of an operation of the control section 60 in a case in which the control section 60 accesses the bank Bank0 as an example. For example, in a case in which the control section 60 receives the activate command ACT from the interface 40, the control section 60 controls the row decoder 602 and the column decoder 603 on the basis of the address ADD and selects the memory cell 70 indicated by the address ADD. Thereafter, for example, in a case in which the control section 60 receives the write command WR from the interface 40, the control section 60 writes data to the memory cell 70 selected by the activate command ACT through the writing and reading section 604. Moreover, for example, in a case in which the control section 60 receives the read command RD from the interface 40, the control section 60 reads data from the memory cell 70 selected by the activate command ACT through the writing and reading section 604. Thereafter, for example, in a case in which the control section 60 receives the precharge command PR from the interface 40, the control section 60 restores data stored in the memory cells 70 in one row including the memory cell 70 selected by the activate command ACT.

Moreover, for example, in a case in which the control section 60 receives the refresh command REF from the interface 40, the control section 60 controls the row decoder 602 and selects the memory cells 70 in one row of the memory array 601. Thereafter, the control section 60 controls the writing and reading section 604 and restores data stored in the memory cells 70 in the one row. At this occasion, the control section 60 sequentially selects rows of the memory array 601 every time the control section 60 receives the refresh command REF. In other words, in a case in which the refresh command REF is supplied to the control section 60, the address ADD is not supplied to the control section 60, and accordingly, the control section 60 sequentially designates rows of the memory array 601. Consequently, data stored in all of the memory cells 70 in the memory array 601 is restored within predetermined time.

Herein, the image sensor 11 corresponds to a specific example of a "sensor section" in the present disclosure. The DRAMs 50 to 53 correspond to specific examples of a "memory section" in the present disclosure. The banks Bank0 and Bank1 correspond to specific examples of a "memory region" in the present disclosure. The signal processor 20 corresponds to a specific example of an "arithmetic operation section" in the present disclosure.

[Operation and Workings]

Next, description is given of an operation and workings of the sensor module 1 according to the present embodiment.

(General Operation Outline)

First, description is given of a general operation outline of the sensor module 1 with reference to FIGS. 1 and 2. The image sensor 11 acquires image data. The ADC 12 converts a detection voltage (an analog voltage) in each pixel supplied from the image sensor 11 into a digital code. The signal processor 20 performs predetermined signal processing on the image data supplied from the ADC 12. At this occasion, the signal processor 20 accesses the DRAMs 50 to 53 through the memory control section 30 and the interfaces 40 to 43.

The memory control section 30 controls the DRAMs 50 to 53 through the interfaces 40 to 43 in accordance with an instruction from the signal processor 20. More specifically, the write interface 31 arbitrates access from the write client CW that operates in the signal processor 20. The read interface 32 arbitrates access from the read client CR that operates in the signal processor 20. The controller 33 controls operations of the DRAMs 50 and 53 through the interfaces 40 to 43 on the basis of instructions from the write interface 31 and the read interface 32.

(Detailed Operation)

FIG. 4 illustrates an operation example of the sensor module 1. In this example, the memory control section 30 provides, to each of the DRAMs 50 to 53, instructions for a refresh operation, a data reading operation (read access P1), and a data writing operation (write access P2). This operation is described in detail below.

First, in the memory control section 30, the refresh controller 34 generates the refresh command REF. Thereafter, the controller 33 supplies the refresh command REF to the DRAM 50 through the interface 40, to the DRAM 51 through one register 311 and the interface 41, to the DRAM 52 through two registers 321 and 322 and the interface 42, and to the DRAM 53 through three registers 331 to 333 and the interface 43, as illustrated in FIG. 2.

Thus, the DRAMs 50 to 53 sequentially perform the refresh operation as illustrated in FIG. 4. More specifically, the DRAM 50 performs the refresh operation in a period from a timing t1 to a timing t2. The DRAM 51 performs the refresh operation in a period from the timing t2 to a timing t3. The DRAM 52 performs the refresh operation in a period from the timing t3 to a timing t4. The DRAM 53 performs the refresh operation in a period from the timing t4 to a timing t5.

Subsequently, the controller 33 performs reading of data from the banks Bank0 of the DRAMs 50 to 53 in accordance with an instruction from the read client CR (read access P1). More specifically, the controller 33 sequentially generates the activate command ACT, the read command RD, and the precharge command PRE. The controller 33 supplies these commands to the DRAM 50 through the interface 40, to the DRAM 51 through one register 311 and the interface 41, to the DRAM 52 through two registers 321 and 322 and the interface 42, and to the DRAM 53 through three registers 331 to 333 and the interface 43, as illustrated in FIG. 2.

Thus, the DRAMs 50 to 53 sequentially select the memory cell 70 in the bank Bank0, sequentially perform reading of data, and sequentially perform restoring of data, as illustrated in FIG. 4. More specifically, the DRAM 50 selects the memory cell 70 in the bank Bank0 in a period from the timing t3 to the timing t4. The DRAM 51 selects the memory cell 70 in the bank Bank0 in a period from the timing t4 to the timing t5. The DRAM 52 selects the memory cell 70 in the bank Bank0 in a period from the timing t5 to a timing t6. The DRAM 53 selects the memory cell 70 in the bank Bank0 in a period from the timing t6 to a timing t7. Thereafter, the DRAM 50 performs reading of data in a period from the timing t5 to a timing t9. The DRAM 51 performs reading of data in a period from the timing t6 to a timing t10. The DRAM 52 performs reading of data in a period from the timing t7 to a timing t11. The DRAM 53 performs reading of data in a period from a timing t8 to a timing t12. Thereafter, the DRAM 50 performs restoring of data in a period from the timing t10 to the timing t11. The DRAM 51 performs restoring of data in a period from the timing t11 to the timing t12. The DRAM 52 performs restoring of data in a period from the timing t12 to a timing t13. The DRAM 53 performs restoring of data in a period from the timing t13 to a timing t14.

Likewise, the controller 33 performs reading of data from the banks Bank1 of the DRAMs 50 to 53 (read access P1). Thus, the DRAMs 50 to 53 sequentially select the memory cell 70 in the bank Bank1, sequentially perform reading of data, and sequentially perform restoring of data, as illustrated in FIG. 4. More specifically, the DRAM 50 selects the memory cell 70 in the bank Bank1 in a period from the timing t7 to the timing t8. The DRAM 51 selects the memory cell 70 in the bank Bank1 in a period from the timing t8 to the timing t9. The DRAM 52 selects the memory cell 70 in the bank Bank1 in a period from the timing t9 to the timing t10. The DRAM 53 selects the memory cell 70 in the bank Bank1 in a period from the timing t10 to the timing t11. Thereafter, the DRAM 50 performs reading of data in a period from the timing t9 to the timing t13. The DRAM 51 performs reading of data in a period from the timing t10 to the timing t14. The DRAM 52 performs reading of data in a period from the timing t11 to a timing t15. The DRAM 53 performs reading of data in a period from the timing t12 to a timing t16. Thereafter, the DRAM 50 performs restoring of data in a period from the timing t14 to the timing t15. The DRAM 51 performs restoring of data in a period from the timing t15 to the timing t16. The DRAM 52 performs restoring of data in a period from the timing t16 to a timing t17. The DRAM 53 performs restoring of data in a period from the timing t17 to a timing t18.

Subsequently, the controller 33 performs writing of data to the banks Bank0 of the DRAMs 50 to 53 in accordance with an instruction from the write client CW (write access P2). Thus, as with a case in the read access P1, the DRAMs 50 to 53 sequentially select the memory cell 70 in the bank Bank0, sequentially perform writing of data, and sequentially perform restoring of data, as illustrated in FIG. 4. Likewise, the controller 33 performs writing of data to the banks Bank1 of the DRAMs 50 to 53 (write access P2). Thus, the DRAMs 50 to 53 sequentially select the memory cell 70 in the bank Bank1, sequentially perform writing of data, and sequentially perform restoring of data.

Thereafter, the controller 33 performs reading of data from the DRAMs 50 to 53 in accordance with an instruction from the read client CR, and performs writing of data to the DRAMs 50 to 53 in accordance with an instruction from the write client CW. Thereafter, the controller 33 periodically generates the refresh command REF and supplies the refresh command REF to the DRAMs 50 to 53.

As described above, in the sensor module 1, the read access P1 and the write access P2 to the banks Bank0 and Bank1 of the DRAMs 50 to 53 start at different timings. Accordingly, for example, the banks Bank0 and Bank1 of the DRAMs 50 to 53 perform selection of the memory cell 70 on the basis of the activate command ACT in different periods of a period from the timing t3 to the timing t11, and sequentially start reading of data on the basis of the read command RD from the timing t5, and perform restoring of data on the basis of the precharge command PRE in different periods of a period from the timing t10 to the timing t18. As a result, in the sensor module 1, unlike a comparative example to be described later, it is possible to reduce a possibility that noises generated by the DRAMs 50 to 53 overlap, thereby decreasing a peak of a noise amount generated by the DRAMs 50 to 53.

Moreover, in the sensor module 1, decreasing the peak of the noise amount generated by the DRAMs 50 to 53 makes it possible to reduce degradation in detection accuracy of the image sensor 11. In other words, in the sensor module 1, the image sensor 11 outputs an analog voltage, and the ADC 12 converts the analog voltage into a digital code. Accordingly, for example, if noises generated by the DRAMs 50 to 53 exert an influence on an operation of the ADC 12, the detection accuracy of the image sensor 11 may be degraded. In the sensor module 1, the peak of the noise amount generated by the DRAMs 50 to 53 is reduced in such a manner; therefore, it is possible to reduce the possibility that the noises exert the influence on the operation of the ADC 12, thereby reducing degradation in the detection accuracy of the image sensor 11.

Comparative Example

Next, description is given of a sensor module 1R according to a comparative example. The present comparative example is different from the present embodiment in the memory control section. In other words, in the present embodiment (FIG. 2), the register is inserted between the controller 33 and each of the DRAMs 50 to 53. In contrast, in the present comparative example, the memory control section is configured without inserting these registers. Other configurations are similar to those in the present embodiment (FIGS. 1 to 3).

FIG. 5 illustrates a configuration example of a memory control section 30R of the sensor module 1R according to the present comparative example. The memory control section 30R includes the write interface 31, the read interface 32, and the controller 33. The controller 33 supplies the address ADD and the control command CMD to the DRAM 50 through the interface 40, to the DRAM 51 through the interface 41, to the DRAM 52 through the interface 42, and to the DRAM 53 through the interface 43. Moreover, the controller 33 supplies the write data WrDATA0 to the DRAM 50 through the interface 40. The controller 33 supplies the write data WrDATA1 to the DRAM 51 through the interface 41. The controller 33 supplies the write data WrDATA2 to the DRAM 52 through the interface 42. The controller 33 supplies write data WrDATA3 to the DRAM 53 through the interface 43. Moreover, the controller 33 receives the read data RdDATA0 from the DRAM 50 through the interface 40. The controller 33 receives the read data RdDATA1 from the DRAM 51 through the interface 41. The controller 33 receives the read data RdDATA2 from the DRAM 52 through the interface 42. The controller 33 receives the read data RdDATA3 from the DRAM 53 through the interface 43. In other words, the memory control section 30R is the memory control section 30 (FIG. 2) without the registers 301 to 303, 311 to 313, 321 to 323, and 331 to 333.

FIG. 6 illustrates an operation example of the DRAMs 50 to 53.

First, in the memory control section 30R, the refresh controller 34 generates the refresh command REF. Thereafter, the controller 33 supplies the refresh command REF to the DRAM 50 through the interface 40, to the DRAM 51 through the interface 41, to the DRAM 52 through the interface 42, and to the DRAM 53 through the interface 43, as illustrated in FIG. 6. Thus, the DRAMs 50 to 53 concurrently perform the refresh operation in a period from a timing t81 to a timing t82, as illustrated in FIG. 6.

Subsequently, the controller 33 performs reading of data from the banks Bank0 of the DRAMs 50 to 53 in accordance with an instruction from the read client CR (read access P1). More specifically, the controller 33 sequentially generates the activate command ACT, the read command RD, and the precharge command PRE. Thereafter, the controller 33 supplies these commands to the DRAM 50 through the interface 40, to the DRAM 52 through the interface 41, to the DRAM 52 through the interface 42, and to the DRAM 53 through the interface 43, as illustrated in FIG. 5. Thus, the DRAMs 50 to 53 concurrently select the memory cells 70 in the banks Bank0 in a period from a timing t83 to a timing t84, concurrently perform reading of data in a period from a timing t85 to a timing t88, and concurrently perform restoring of data in a period from a timing t89 to a timing t90, as illustrated in FIG. 6.

Likewise, the controller 33 performs reading of data from the banks Bank1 of the DRAMs 50 to 53 (read access P1). Thus, the DRAMs 50 to 53 concurrently select the memory cells 70 in the banks Bank1 in a period from a timing t86 to a timing t87, concurrently perform reading of data in a period from a timing t88 to a timing t91, and concurrently perform restoring of data in a period from a timing from a timing t92 to a timing t93, as illustrated in FIG. 6.

Subsequently, the controller 33 performs writing of data to the banks Bank0 of the DRAMs 50 to 53 in accordance with an instruction from the write client CW (write access P2). Thus, as with a case in the read access P1, the DRAMs 50 to 53 concurrently select the memory cells 70 in the banks Bank0, concurrently perform writing of data, and concurrently perform restoring of data, as illustrated in FIG. 6. Likewise, the controller 33 performs writing of data to the banks Bank1 of the DRAMs 50 to 53 (write access P2). Thus, the DRAMs 50 to 53 concurrently select the memory cells 70 in the banks Bank1, concurrently perform writing of data, and concurrently perform restoring of data.

Thus, in the sensor module 1R according to the comparative example, the read access P1 or the write access P2 to the banks Bank0 of the DRAMs 50 to 53 concurrently starts, and likewise, the read access P1 or the write access P2 to the banks Bank1 of the DRAMs 50 to 53 concurrently starts. Thus, in the sensor module 1R, noises generated by the DRAMs 50 to 53 overlap, which causes an increase in a noise amount. Accordingly, the detection accuracy of the image sensor 11 may be degraded.

In contrast, in the sensor module 1 according to the present embodiment, the read access P1 or the write access P2 to the banks Bank0 and Bank1 of the DRAMs 50 to 53 starts at different timings, which makes it possible to reduce a possibility that noises generated by the DRAMs 50 to 53 overlap. As a result, in the sensor module 1, it is possible to reduce the peak of the noise amount generated by the DRAMs 50 to 53, and to reduce a possibility that the detection accuracy of the image sensor 11 is degraded.

Effects

As described above, in the present embodiment, the banks of the respective DRAMs start the reading operation or the writing operation at different timings. This makes it possible to reduce the peak of the noise amount generated by the DRAMs, and to reduce the possibility that the detection accuracy of the image sensor is degraded.

Modification Example 1-1

In the foregoing embodiment, four DRAMs 50 to 53 are provided, but the number of DRAMs is not limited thereto. Three or less DRAMs may be provided, or five or more DRAMs may be provided.

Modification Example 1-2

In the foregoing embodiment, the DRAMs 50 to 53 each include two banks Bank0 and Bank1, but the number of banks is not limited thereto. The DRAMs 50 to 53 may each include three or more banks, or may not include a plurality of banks.

2. Second Embodiment

Next, description is given of a sensor module 2 according to a second embodiment. The present embodiment is different from the foregoing first embodiment in a method of controlling the refresh operation. It is to be noted that substantially same components as the components of the sensor module 1 according to the foregoing first embodiment are denoted by same reference numerals, and any redundant description thereof is omitted.

FIG. 7 illustrates a configuration example of the sensor module 2 according to the present embodiment. The sensor module 2 includes a signal processor 80 and a memory control section 90.

The signal processor 80 performs predetermined signal processing on image data supplied from the ADC 12 as with the signal processor 20 according to the first embodiment. In the signal processor 80, a dummy client CD operates in addition to the write client CW and the read client CR, and the write client CW, the read client CR, and the dummy client CD access the DRAMs 50 to 53 through the memory control section 90 and the interfaces 40 to 43. As with the read client CR, the dummy client CD supplies the address ADD to the memory control section 90, and receives, from the memory control section 90, the read data RdDATA read from the DRAMs 50 to 53. At this occasion, the dummy client CD periodically supplies the address ADD to the memory control section 90 while changing the address ADD. It may be possible to generate the address ADD with use of, for example, a counter. Moreover, for example, the address ADD in a memory region that has not been accessed recently may be generated. Further, the dummy client CD in this example does not perform any arithmetic operation processing on the basis of the received read data RdDATA.

The memory control section 90 controls the DRAMs 50 to 53 through the interfaces 40 to 43 in accordance with an instruction from the signal processor 80, as with the memory control section 30 according to the first embodiment.

FIG. 8 illustrates a configuration example of the memory control section 90. The memory control section 90 includes a controller 93. The controller 93 is the controller 33 according to the first embodiment without providing the refresh controller 34.

With this configuration, in the sensor module 2, the dummy client CD instructs the DRAMs 50 to 53 to perform restoring of data. In other words, in the sensor module 1 according to the foregoing first embodiment, the refresh controller 34 instructs the DRAMs 50 to 53 to perform restoring of data, whereas, in the sensor module 2 according to the present embodiment, the dummy client CD of the signal processor 80 instructs the DRAMs 50 to 53 to perform restoring of data.

FIG. 9 illustrates an operation example of the sensor module 2. In the sensor module 2, unlike the sensor module 1 according to the first embodiment (FIG. 4), the refresh command REF is not generated. Accordingly, the DRAMs 50 to 53 restore data by dummy read access P3 as with the refresh operation.

First, the controller 93 performs reading of data from the banks Bank0 of the DRAMs 50 to 53 in accordance with an instruction from the dummy client CD (dummy read access P3). More specifically, the controller 93 sequentially generates the activate command ACT, the read command RD, and the precharge command PRE. Thereafter, the controller 93 supplies these commands to the DRAM 50 through the interface 40, to the DRAM 51 through one register 311 and the interface 41, to the DRAM 52 through two registers 321 and 322 and the interface 42, and to the DRAM 53 through three registers 331 to 333 and the interface 43, as illustrated in FIG. 8. Thus, the DRAMs 50 to 53 sequentially select the memory cell 70 in the bank Bank0, sequentially perform reading of data, and sequentially perform restoring of data, as illustrated in FIG. 9.

Likewise, the controller 93 performs reading of data from the banks Bank1 of the DRAM 50 to 53 (dummy read access P3). Thus, the DRAMs 50 to 53 sequentially select the memory cell 70 in the bank Bank0, sequentially perform reading of data, and sequentially perform restoring of data, as illustrated in FIG. 9.

As described above, in the sensor module 2, the dummy client CD instructs the DRAMs 50 to 53 to perform restoring of data. In other words, restoring of data is performed with effective use of the activate command ACT and the precharge command PRE instead of the refresh command REF in the first embodiment. In the sensor module 2, this makes it possible to further reduce the peak of the noise amount generated by the DRAMs 50 to 53, as compared with the sensor module 1 according to the first embodiment. In other words, in the sensor module 1 according to the first embodiment, the banks Bank0 and Bank1 in each of the DRAMs 50 to 53 concurrently perform the refresh operation as illustrated in FIG. 4, which may cause a slight increase in noise amount. In contrast, in the sensor module 2, restoring of data is performed with use of the precharge command PRE instead of the refresh command REF. The restoring of data based on the precharge command PRE is performed in different periods of a period from a timing t28 to a timing t36 as illustrated in FIG. 9, which makes it possible to reduce the peak of the noise amount. Accordingly, in the sensor module 2, it is possible to reduce the possibility that the detection accuracy of the image sensor 11 is degraded.

As described above, in the present embodiment, the dummy client instructs the DRAMs to perform restoring of data, which makes it possible to reduce the peak of the noise amount generated by the DRAMs, and to reduce the possibility that the detection accuracy of the image sensor is degraded.

Modification Example 2-1

In the foregoing embodiment, the dummy client CD receives the read data RdDATA from the memory control section 90; however, the foregoing embodiment is not limited thereto. Alternatively, for example, the dummy client CD may not receive the read data RdDATA from the memory control section 90. More specifically, for example, it may be possible for the read interface 32 not to supply the read data RdDATA to the dummy client CD. Moreover, for example, in a case in which the dummy client CD instructs access to the DRAMs 50 to 53, for example, the controller 93 may generate only the activate command ACT and the precharge command PRE and may not generate the read command RD (dummy access P4), as illustrated in FIG. 10. In this case, the DRAMs 50 to 53 sequentially select the memory cell 70 in the bank Bank0, and perform restoring of data, and likewise, the DRAMs 50 to 53 sequentially select the memory cell 70 in the bank Bank1, and perform restoring of data. Even in such a configuration, similar effects to those in the foregoing embodiment are achievable.

Modification Example 2-2

In the foregoing embodiment, the dummy client CD instructs the memory control section 90 to perform reading of data, but the present embodiment is not limited thereto. Alternatively, the dummy client CD may instruct the memory control section 90 to perform writing of data. In this case, the dummy client CD may supply the address ADD and the write data WrDATA to the write interface 31.

3. Application Examples

Next, description is given of application examples of the sensor modules described in the foregoing embodiments and modification examples.

FIG. 11 illustrates an appearance of a smartphone to which any of the sensor modules according to the foregoing embodiments and examples is applied. The smartphone 100 may include, for example, a main body section 110 and a display section 120. The foregoing sensor module is mounted on the smartphone 100.

FIG. 12 illustrates an appearance of a lens-interchangeable single-lens reflex digital camera 200 to which any of the sensor modules according to the foregoing embodiments and examples is applied. The digital camera may include a main body section (camera body) 210, an interchangeable photographing lens unit 220, and a grip section 230. The foregoing sensor module is mounted on the digital camera 200.

The sensor modules according to the foregoing embodiments and examples are applicable to electronic apparatuses in every field equipped with an image sensor such as a tablet computer, a digital camera, a video camera, and a notebook personal computer in addition to the smartphone and the digital camera.

Although the present technology has been described above referring to some embodiments and examples, the present technology is not limited thereto, and may be variously modified.

For example, in the foregoing respective embodiments and examples, the sensor module includes the image sensor 11; however, the configuration of the sensor module is not limited thereto. Alternatively, the sensor module may include a sensor of any other kind.

Note that the effects described in the present specification are illustrative and non-limiting. Effects achieved by the technology may be effects other than those described above.

It is to be noted that the present technology may have the following configurations.

(1) A sensor module, including:
a sensor section;
a memory section having a plurality of memory regions;
an arithmetic operation section that performs a predetermined arithmetic operation while accessing the memory section on a basis of a detection result of the sensor section; and
a memory control section that controls the memory section to start access to the memory regions at different timings.

(2) The sensor module according to (1), wherein
the memory regions are grouped into a plurality of memory groups, and
a predetermined number of the memory regions belong to each of the memory groups.

(3) The sensor module according to (2), wherein
the memory control section includes a first delay section, and a second delay section having a delay amount that is different from a delay amount of the first delay section, and
the memory control section supplies a control command to a first memory group of the memory groups through the first delay section, and supplies the control command to a second memory group of the memory groups through the second delay section.

(4) The sensor module according to (3), wherein
the memory control section includes a third delay section, and a fourth delay section having a delay amount that is different from a delay amount of the third delay section,
the memory control section receives first read data from the first memory group through the third delay section, and receives second read data from the second memory group through the fourth delay section, and
the sum of the delay amount in the first delay section and the delay amount in the third delay section is equal to the sum of the delay amount in the second delay section and the delay amount in the fourth delay section.

(5) The sensor module according to any one of (1) to (4), wherein
each of the memory regions includes a plurality of memory cells,
the arithmetic operation section intermittently accesses each of the memory cells, and
when the arithmetic operation section accesses each of the memory cells, the memory control section performs restoring of data stored in the accessed memory cell.

(6) The sensor module according to (5), wherein the arithmetic operation section intermittently performs read access to each of the memory cells.

(7) The sensor module according to any one of (1) to (4), wherein
each of the memory regions includes a plurality of memory cells, and the memory control section intermittently perform, on each of the memory cells, restoring of data stored in the memory cell.

(8) The sensor module according to any one of (1) to (7), wherein the sensor section is an image sensor.

(9) A method of controlling a sensor module, including:
performing a predetermined arithmetic operation while accessing a memory section having a plurality of memory regions on a basis of a detection result of a sensor section; and
controlling the memory section to start access to the memory regions at different timings.

(10) An electronic apparatus provided with a sensor module and a control section that controls the sensor module, the sensor module including:
a sensor section;
a memory section having a plurality of memory regions;
an arithmetic operation section that performs a predetermined arithmetic operation while accessing the memory section on a basis of a detection result of the sensor section; and
a memory control section that controls the memory section to start access to the memory regions at different timings.

This application claims the priority on the basis of Japanese Patent Application No. 2014-105137 filed on May 21, 2014 with Japan Patent Office, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:
1. A sensor module, comprising:
a sensor section;
a memory section having a plurality of memory regions grouped into a plurality of memory groups,
wherein a determined number of the memory regions belong to each memory group of the plurality of memory groups;
an arithmetic operation section configured to:
perform an arithmetic operation based on a detection result of the sensor section; and
access the memory section while performing the arithmetic operation; and
a memory control section comprising:
at least a first delay section; and
a second delay section,
wherein a delay amount of the second delay section is different from a delay amount of the first delay section,
wherein the memory control section is configured to:
control the memory section to start access to the plurality of memory regions at different timings;
supply a control command to a first memory group of the plurality of memory groups through the first delay section; and
supply the control command to a second memory group of the plurality of memory groups through the second delay section.

2. The sensor module according to claim 1,
wherein the memory control section further comprises:
a third delay section; and
a fourth delay section,
wherein a delay amount of the fourth delay section is different from a delay amount of the third delay section,
wherein the memory control section is further configured to:
receive a first read data from the first memory group through the third delay section; and
receive a second read data from the second memory group through the fourth delay section,
wherein a first sum of the delay amount of the first delay section and the delay amount of the third delay section is equal to a second sum of the delay amount of the second delay section and the delay amount of the fourth delay section.

3. The sensor module according to claim 1, wherein
each memory region of the plurality of memory regions comprises a plurality of memory cells,
the arithmetic operation section is further configured to intermittently access each memory cell of the plurality of memory cells, and
based on access of each memory cell by the arithmetic operation section, the memory control section is further configured to restore data stored in a memory cell accessed by the arithmetic operation section.

4. The sensor module according to claim 3, wherein the arithmetic operation section is further configured to intermittently read each memory cell of the plurality of memory cells.

5. The sensor module according to claim 1, wherein
each memory region of the plurality of memory regions comprises a plurality of memory cells, and
the memory control section is further configured to intermittently restore data stored in each memory cell of the plurality of memory cells.

6. The sensor module according to claim 1, wherein the sensor section is an image sensor.

7. A method of controlling a sensor module, comprising:
performing an arithmetic operation based on a detection result of a sensor section;

accessing a memory section when performing the arithmetic operation,
wherein the memory section comprises a plurality of memory regions grouped into a plurality of memory groups, and
wherein a determined number of the memory regions belong to each memory group of the plurality of memory groups;
controlling the memory section to start access to the plurality of memory regions at different timings;
supplying a control command to a first memory group of the plurality of memory groups through a first delay section; and
supplying the control command to a second memory group of the plurality of memory groups through a second delay section,
wherein a delay amount of the first delay section is different from a delay amount of the second delay section.

8. An electronic apparatus, comprising:
a sensor module; and
a control section configured to control the sensor module, the sensor module comprising:
  a sensor section;
  a memory section having a plurality of memory regions grouped into a plurality of memory groups,
  wherein a determined number of the memory regions belong to each memory group of the plurality of memory groups;
  an arithmetic operation section configured to:
    perform an arithmetic operation based on a detection result of the sensor section; and
    access the memory section when performing the arithmetic operation; and
a memory control section comprising:
  at least a first delay section; and
  a second delay section,
  wherein a delay amount of the second delay section is different from a delay amount of the first delay section,
wherein the memory control section is configured to:
  control the memory section to start access to the plurality of memory regions at different timings;
  supply a control command to a first memory group of the plurality of memory groups through the first delay section; and
  supply the control command to a second memory group of the plurality of memory groups through the second delay section.

* * * * *